United States Patent
Hosoda et al.

(10) Patent No.: US 10,844,153 B2
(45) Date of Patent: Nov. 24, 2020

(54) MATERIAL FOR PRINTED CIRCUIT BOARD, METAL LAMINATE, METHODS FOR PRODUCING THEM, AND METHOD FOR PRODUCING PRINTED CIRCUIT BOARD

(71) Applicant: AGC Inc., Chiyoda-ku (JP)

(72) Inventors: Tomoya Hosoda, Chiyoda-ku (JP); Wataru Kasai, Chiyoda-ku (JP); Toru Sasaki, Chiyoda-ku (JP); Masatoshi Abe, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 309 days.

(21) Appl. No.: 15/786,876

(22) Filed: Oct. 18, 2017

(65) Prior Publication Data
US 2018/0050516 A1 Feb. 22, 2018

Related U.S. Application Data

(63) Continuation of application No. PCT/JP2016/063760, filed on May 9, 2016.

(30) Foreign Application Priority Data

May 11, 2015 (JP) ................................ 2015-096471

(51) Int. Cl.
| | |
|---|---|
| B32B 15/08 | (2006.01) |
| H05K 1/03 | (2006.01) |
| H05K 3/06 | (2006.01) |
| C08F 214/26 | (2006.01) |
| B32B 27/30 | (2006.01) |
| C09J 135/00 | (2006.01) |
| C09J 7/35 | (2018.01) |
| C09J 7/25 | (2018.01) |
| H05K 3/38 | (2006.01) |
| C09J 127/18 | (2006.01) |
| B32B 7/12 | (2006.01) |
| B32B 37/06 | (2006.01) |
| C09J 5/06 | (2006.01) |
| C23F 1/00 | (2006.01) |
| H05K 3/02 | (2006.01) |
| C09J 129/10 | (2006.01) |

(52) U.S. Cl.
CPC ............ *C08F 214/262* (2013.01); *B32B 7/12* (2013.01); *B32B 15/08* (2013.01); *B32B 27/30* (2013.01); *B32B 37/06* (2013.01); *C08F 214/265* (2013.01); *C09J 5/06* (2013.01); *C09J 7/25* (2018.01); *C09J 7/35* (2018.01); *C09J 127/18* (2013.01); *C09J 135/00* (2013.01); *C23F 1/00* (2013.01); *H05K 1/0353* (2013.01); *H05K 3/06* (2013.01); *H05K 3/386* (2013.01); *B32B 2307/306* (2013.01); *B32B 2309/02* (2013.01); *B32B 2457/08* (2013.01); *C09J 129/10* (2013.01); *C09J 2203/326* (2013.01); *C09J 2400/163* (2013.01); *C09J 2427/00* (2013.01); *C09J 2479/086* (2013.01); *H05K 1/0393* (2013.01); *H05K 3/022* (2013.01); *H05K 2201/015* (2013.01); *H05K 2201/0154* (2013.01); *H05K 2201/068* (2013.01)

(58) Field of Classification Search
None
See application file for complete search history.

(56) References Cited

U.S. PATENT DOCUMENTS

| | | | | |
|---|---|---|---|---|
| 3,616,177 | A * | 10/1971 | Gumerman | C08J 7/0427 428/216 |
| 5,821,031 | A * | 10/1998 | Hashimoto | G03F 7/027 430/280.1 |
| 6,015,520 | A * | 1/2000 | Appelt | B29C 61/006 264/104 |
| 6,764,748 | B1 * | 7/2004 | Farquhar | B32B 27/36 174/250 |
| 2004/0101787 | A1 * | 5/2004 | Naito | G03F 7/0046 430/325 |

(Continued)

FOREIGN PATENT DOCUMENTS

| | | |
|---|---|---|
| EP | 0 842 959 A1 | 5/1998 |
| JP | 10-264327 | 10/1998 |
| JP | 2013-67810 | 4/2013 |

(Continued)

OTHER PUBLICATIONS

International Search Report dated Jul. 19, 2016 in PCT/JP2016/063760, filed on May 9, 2016.

*Primary Examiner* — Shamim Ahmed
(74) *Attorney, Agent, or Firm* — Oblon, McClelland, Maier & Neustadt, L.L.P.

(57) ABSTRACT

A material having a fluorinated resin layer is subjected to heat treatment. The fluorinated resin layer is composed of a composition containing a fluorinated copolymer (a) having at least one type of functional group selected from a carbonyl group-containing group, a hydroxy group, an epoxy group and an isocyanate group, having a melting point of from 280 to 320° C. and a melt flow rate of at least 2 g/10 min measured at 372° C. under a load of 49 N. The heat treatment is carried out at a temperature of at least 250° C. and lower by at least 5° C. than the melting point of the fluorinated copolymer (a) so that the ratio of the melt flow rate of the fluorinated resin layer after the heat treatment to that before the heat treatment, and the melt flow rate of the fluorinated resin layer after the heat treatment, are respectively within specific ranges.

12 Claims, No Drawings

(56) References Cited

U.S. PATENT DOCUMENTS

2012/0219767 A1* 8/2012 Ting .................... B32B 7/12
428/195.1
2016/0078979 A1  3/2016 Hosoda et al.

FOREIGN PATENT DOCUMENTS

| WO | WO 97/45467 A1 | 12/1997 |
| WO | WO 2006/067970 A1 | 6/2006 |
| WO | WO 2010/084867 A1 | 7/2010 |
| WO | WO 2012/070401 A1 | 5/2012 |
| WO | WO 2015/002251 A1 | 1/2015 |

* cited by examiner

MATERIAL FOR PRINTED CIRCUIT BOARD, METAL LAMINATE, METHODS FOR PRODUCING THEM, AND METHOD FOR PRODUCING PRINTED CIRCUIT BOARD

TECHNICAL FIELD

The present invention relates to a material for a printed circuit board, a metal laminate, methods for producing them, and a method for producing a printed circuit board.

BACKGROUND ART

In recent years, along with weight reduction, size reduction and high densification of electronic products, demand for various types of printed circuit boards is expanding. Particularly, demand for flexible metal laminates is increasing. A flexible metal laminate is also called a flexible printed circuit board or the like.

A flexible printed circuit board is produced e.g. by a method of bonding a metal foil on an insulating film as a substrate by means of an adhesive material by heating and contact bonding, and etching the metal foil to form a circuit.

As the insulating film, a polyimide film or the like is preferably used, and as the adhesive material, e.g. an epoxy or acrylic thermosetting adhesive is commonly used.

The thermosetting adhesive is advantageous in that bonding at a relatively low temperature is possible, however, it is considered that a flexible printed circuit board having an adhesive layer composed of a thermosetting adhesive can hardly meet required demands such as heat resistance, flexibility and electrical reliability which are considered to be stricter in the future.

Accordingly, as a flexible printed circuit board using no thermosetting adhesive, a flexible printed circuit board having a metal foil directly bonded to an insulating film has been proposed. Further, for example, Patent Document 1 proposes a flexible printed circuit board using a thermoplastic polyimide for the adhesive layer.

Further, Patent Document 2 proposes a flexible printed circuit board having a reinforcing layer of e.g. a polyimide resin and an electrical conductive layer such as a copper foil laminated via an electrical insulator layer made of a fluorinated copolymer having an acid anhydride residue. The fluorinated copolymer constituting the electrical insulator layer has adhesion due to the acid anhydride residue, and accordingly the electrical insulator layer functions also as an adhesive layer. Further, by using the fluorinated copolymer, which is excellent in electrical properties, for a layer in contact with the electrical conductive layer (metal foil), excellent electrical reliability will be obtained as compared with a case where a thermoplastic polyimide is used for the adhesive layer.

However, a flexible printed circuit board having a layer of the fluorinated copolymer as an insulating layer, is likely to be warped at high temperature.

Patent Document 3 discloses a technique of mixing a thermoplastic polyimide with the fluorinated copolymer to improve heat resistant stiffness. However, even by the method of mixing another resin, the warpage cannot sufficiently be suppressed at a high temperature region (150 to 200° C.).

Further, it is known that electrical properties such as dielectric constant which are excellent characteristics of a fluororesin decrease if a thermoplastic polyimide is mixed with a fluorinated copolymer as in Patent Document 3.

Particularly for applications for high frequency, the material of an insulating layer to be in a direct contact with the metal layer is required to have a low dielectric constant and a low dielectric loss tangent and excellent electrical properties. Accordingly, it is desired to improve properties such as stiffness of a fluorinated copolymer to be used for an insulating layer without mixing another material such as a thermoplastic polyimide as far as possible.

PRIOR ART DOCUMENTS

Patent Documents

Patent Document 1: JP-A-2013-67810
Patent Document 2: WO2006/067970
Patent Document 3: WO2012/070401

DISCLOSURE OF INVENTION

Technical Problem

The present invention has been made under the above circumstances, and it is an object of the present invention to provide a material for a printed circuit board which is less likely to be warped at a high temperature region (150 to 200° C.) while it maintains electrical properties, a metal laminate, methods for producing them, and a method for producing a printed circuit board.

Solution to Problem

The present invention has the following aspects [1] to [15].

[1] A method for producing a material for a printed circuit board, which comprises subjecting a film (A) provided with a fluorinated resin layer composed of a composition containing a fluorinated copolymer (a) to a heat treatment to obtain a material for a printed circuit board, wherein
the film (A) is a film (A1) consisting of the fluorinated resin layer or an adhesive film (A2) having the fluorinated resin layer directly laminated on at least one side of a heat resistant resin film,
the fluorinated copolymer (a) has at least one type of functional group selected from the group consisting of a carbonyl group-containing group, a hydroxy group, an epoxy group and an isocyanate group, has a melting point of from 280 to 320° C., and has a melt flow rate of at least 2 g/10 min measured at 372° C. under a load of 49 N, and
the heat treatment of the film (A) is carried out at a temperature of at least 250° C. and lower by at least 5° C. than the melting point of the fluorinated copolymer (a) so that the ratio of the following MFR(II) to the following MFR(I) [MFR(II)/MFR(I)] is from 0.05 to 0.5 and that the following MFR(II) is at most 15 g/10 min:
MFR(I): the melt flow rate of the fluorinated resin layer before the heat treatment measured at 372° C. under a load of 49 N; and
MFR(II): the melt flow rate of the fluorinated resin layer after the heat treatment measured at 372° C. under a load of 49 N.
[2] The method for producing a material for a printed circuit board according to [1], wherein the fluorinated copolymer (a) has at least a carbonyl group-containing group as the functional group, and the carbonyl group-containing group is at least one member selected from the group consisting of a group having a carbonyl group between carbon atoms in a hydrocarbon group, a carbonate group, a carboxy group, a haloformyl group, an alkoxycarbonyl group and an acid anhydride residue.

[3] The method for producing a material for a printed circuit board according to [1] or [2], wherein the content of the functional group is from 10 to 60,000 groups per $1\times10^6$ carbon atoms in the main chain of the fluorinated copolymer (a).

[4] A material for a printed circuit board, which is a film consisting of a fluorinated resin layer, wherein the fluorinated resin layer is composed of a composition containing a fluorinated copolymer having at least one type of functional group selected from the group consisting of a carbonyl group-containing group, a hydroxy group, an epoxy group and an isocyanate group, has a melt flow rate of at most 15 g/10 min measured at 372° C. under a load of 49 N, and has a storage elastic modulus of at least 650 MPa.

[5] A material for a printed circuit board, which is an adhesive film having a fluorinated resin layer directly laminated on at least one side of a heat resistant resin film, wherein the fluorinated resin layer is composed of a composition containing a fluorinated copolymer having at least one type of functional group selected from the group consisting of a carbonyl group-containing group, a hydroxy group, an epoxy group and an isocyanate group, and has a melt flow rate of at most 15 g/10 min measured at 372° C. under a load of 49 N, and the linear expansion coefficient of the material for a printed circuit board at from 150 to 200° C. is within a range of from 0 to 25 ppm/° C.

[6] A method for producing a metal laminate, which comprises producing a material for a printed circuit board by the method as defined in any one of [1] to [3], and directly laminating a metal layer on the fluororesin layer of the material for a printed circuit board.

[7] A method for producing a printed circuit board, which comprises producing a metal laminate by the method as defined in [6], and etching the metal layer to form a patterned circuit.

[8] The method for producing a printed circuit board according to [7], wherein the formed patterned circuit is soldered by a soldering iron.

[9] A method for producing a metal laminate, which comprises subjecting a metal laminate precursor comprising an adhesive film (A2) having a fluorinated resin layer composed of a compound containing a fluorinated copolymer (a) directly laminated on at least one side of a heat resistant resin film, and a metal layer directly laminated on the at least one fluorinated resin layer, to a heat treatment to obtain a metal laminate, wherein the fluorinated copolymer (a) has at least one type of functional group selected from the group consisting of a carbonyl group-containing group, a hydroxy group, an epoxy group and an isocyanate group, has a melting point of from 280 to 320° C., and has a melt flow rate of at least 2 g/10 min measured at 372° C. under a load of 49 N, and the heat treatment is carried out at a temperature of at least 250° C. and lower by at least 5° C. than the melting point of the fluorinated copolymer (a) so that the ratio of the following MFR(VI) to the following MFR(V) [MFR(VI)/MFR(V)] is from 0.05 to 0.5 and that the following MFR(VI) is at most 15 g/10 min:

MFR(V): the melt flow rate of the fluorinated resin layer before the heat treatment measured at 372° C. under a load of 49 N; and MFR(VI): the melt flow rate of the fluorinated resin layer after the heat treatment measured at 372° C. under a load of 49 N.

[10] The method for producing a metal laminate according to [9], wherein the fluorinated copolymer (a) has at least a carbonyl group-containing group as the functional group, and the carbonyl group-containing group is at least one member selected from the group consisting of a group having a carbonyl group between carbon atoms in a hydrocarbon group, a carbonate group, a carboxy group, a haloformyl group, an alkoxycarbonyl group and an acid anhydride residue.

[11] The method for producing a metal laminate according to [9] or [10], wherein the content of the functional group is from 10 to 60,000 groups per $1\times10^6$ carbon atoms in the main chain of the fluorinated copolymer (a).

[12] The method for producing a metal laminate according to any one of [9] to [11], wherein the fluorinated resin layer has a thickness of from 1 to 20 μm.

[13] A metal laminate comprising an adhesive film having a fluorinated resin layer directly laminated on at least one side of a heat resistant resin film, and a metal layer directly laminated on the at least one fluorinated resin layer, wherein the fluorinated resin layer is composed of a composition containing a fluorinated copolymer having at least one type of functional group selected from the group consisting of a carbonyl group-containing group, a hydroxy group, an epoxy group and an isocyanate group, and has a melt flow rate of at most 15 g/10 min measured at 372° C. under a load of 49 N, and the linear expansion coefficient of the adhesive film at from 150 to 200° C. is within a range of from 0 to 25 ppm/° C.

[14] A method for producing a printed circuit board, which comprises producing a metal laminate by the method as defined in [9] to [12], and etching the metal layer to form a patterned circuit.

[15] The method for producing a printed circuit board according to [14], wherein the patterned circuit is soldered by a soldering iron.

Advantageous Effects of Invention

According to the present invention, it is possible to provide a material for a printed circuit board which is less likely to be warped in a high temperature region (150 to 200° C.), while it maintains electrical properties, a method for producing a material for a printed circuit board, a metal laminate, a method for producing a metal laminate, and a method for producing a printed circuit board.

DESCRIPTION OF EMBODIMENTS

The following definitions of terms apply throughout the specification including Claims.

The "melt flow rate (hereinafter sometimes referred to as MFR)" is a value measured at 372° C. under a load of 49 N.

The term "directly laminated" means that two layers are laminated in direct contact with each other without another layer.

A "constituting unit" means a unit derived from a monomer, as formed by polymerization of the monomer. A constituting unit may be a unit formed directly by a polymerization reaction or may be a unit having part of a unit in a polymer converted to another structure by treating the polymer.

A "fluorinated monomer" means a monomer having a fluorine atom in its molecule, and a "non-fluorinated monomer" means a monomer having no fluorine atom in its molecule.

A "main chain" means a moiety which is the principal carbon chain in a chain compound and which corresponds to a backbone having the maximum carbon number.

A "carbonyl group-containing group" means a group containing a carbonyl group (—C—(=O)—) in its structure.

First Embodiment

According to a first embodiment, the present invention provides a method for producing a material for a printed circuit board, which comprises subjecting a film (A) provided with a fluorinated resin layer composed of a composition containing a specific fluorinated copolymer (a) to a heat treatment to obtain a material for a printed circuit board.

The film (A) is a film (A1) consisting of the fluorinated resin layer, or an adhesive film (A2) having the fluorinated resin layer directly laminated on at least one side of the heat resistant resin film.

In the first embodiment, the heat treatment is carried out at a temperature of at least 250° C. and lower by at least 5° C. that the melting point of the fluorinated copolymer (a) so that the ratio of MFR (II) to MRF (I) [MFR(II)/MFR(I)] is from 0.05 to 0.5 and that MFR(II) is at most 15 g/10 min, where MFR(I) is the melt flow rate of the fluorinated resin layer before the heat treatment, and MFR(II) is the melt flow rate of the fluorinated resin layer after the heat treatment.

The production method according to the first embodiment may comprise, after the material for a printed circuit board is produced by the above step of conducting a heat treatment (hereinafter sometimes referred to as step (I)), a step of directly laminating a metal layer on the fluorinated resin layer of the material for a printed circuit board to produce a metal laminate (hereinafter sometimes referred to as step (II)), a step of etching the metal layer to form a patterned circuit thereby to produce a printed circuit board (hereinafter sometimes referred to as step (III)) and a step of soldering the formed patterned circuit by a soldering iron (hereinafter sometimes referred to as step (IV)).

(Film (A))

The film (A) is a single layer film (A1) consisting of the fluorinated resin layer or a multilayer adhesive film (A2) having the fluorinated resin layer directly laminated on at least one side of a heat resistant resin film.

<Fluorinated Resin Layer>

The fluorinated resin layer is a layer obtained by forming a composition containing a fluorinated copolymer (a).

The fluorinated copolymer (a) used for forming the fluorinated resin layer has MFR of at least 2 g/10 min. When MFR is at least 2 g/10 min, the fluorinated copolymer (a) has melt flowability and is capable of melt forming.

MFR of the fluorinated copolymer (a) is preferably from 2 to 1,000 g/10 min, more preferably from 2 to 100 g/10 min, further preferably from 2 to 30 g/10 min, most preferably from 5 to 20 g/10 min. When MFR is at least the lower limit value of the above range, the fluorinated copolymer (a) is excellent in the forming property, and the fluorinated resin layer will be excellent in the surface smoothness and the appearance. When MFR is at most the upper limit value of the above range, the fluorinated resin layer will be excellent in the mechanical strength.

Further, when the fluorinated copolymer (a) has MFR of from 2 to 15 g/10 min, the heat resistance against the soldering iron tends to improve.

MFR is an index for the molecular weight of the fluorinated copolymer (a), and high MFR indicates a low molecular weight, and low MFR indicates a high molecular weight. The molecular weight of the fluorinated copolymer (a), and thus MFR, can be adjusted by the conditions for producing the fluorinated copolymer (a). For example, if the polymerization time is shortened at the time of polymerization of the monomer, MFR tends to increase. On the other hand, in order to reduce MFR, a method of subjecting the fluorinated copolymer (a) to a heat treatment to form a crosslinked structure thereby to increase the molecular weight; or a method of reducing the amount of a radical polymerization initiator used for production of the fluorinated copolymer (a) may, for example, be mentioned.

The melting point of the fluorinated copolymer (a) used for forming the fluorinated resin layer is from 280° C. to 320° C., preferably from 295° C. to 315° C., particularly preferably from 295° C. to 310° C.

When the melting point of the fluorinated copolymer (a) is at least the lower limit value of the above range, excellent heat resistance will be achieved, and when the after-described printed circuit board is subjected to solder reflow at high temperature or a soldering iron at high temperature is pressed against the printed circuit board, swelling (foaming) of the fluorinated resin layer due to heat tends to be suppressed.

The melting point of the fluorinated copolymer (a) may be adjusted e.g. by the types and the contents of the constituting units constituting the fluorinated copolymer (a), the molecular weight, etc. For example, the higher the ratio of the after-described constituting units (m1), the more the melting point tends to increase.

The fluorinated copolymer (a) has at least one type of functional group (hereinafter sometimes referred to as functional group (i)) selected from the group consisting of a carbonyl group-containing group, a hydroxy group, an epoxy group and an isocyanate group. By the functional group (i), the fluorinated resin layer containing the fluorinated copolymer (a) will be favorably attached to the after-described heat resistant resin film and the metal layer and function as an adhesive layer.

The functional group (i) is present preferably at least either one of the main chain terminal and the side chains of the fluorinated copolymer (a). The fluorinated copolymer (a) may contain one type or two or more types of the functional group (i).

The fluorinated copolymer (a) preferably contains as the functional group (i) at least a carbonyl group-containing group.

A carbonyl group-containing group is a group containing a carbonyl group (—C(=O)—) in its structure and may, for example, be a group having a carbonyl group between carbon atoms in a hydrocarbon group, a carbonate group, a carboxy group, a haloformyl group, an alkoxycarbonyl group or an acid anhydride residue.

The hydrocarbon group may, for example, be a $C_{2-8}$ alkylene group. The number of carbon atoms in the alkylene group is a number of carbon atoms not including the carbonyl group. The alkylene group may be linear or branched.

The haloformyl group is represented by —C(=O)—X (wherein X is a halogen atom). The halogen atom in the haloformyl group may, for example, be a fluorine atom or a chlorine atom, and is preferably a fluorine atom. That is, the haloformyl group is preferably a fluoroformyl group (also called a carbonyl fluoride group).

The alkoxy group in the alkoxycarbonyl group may be linear or branched, and is preferably a $C_{1-8}$ alkoxy group, particularly preferably a methoxy group or an ethoxy group.

The content of the functional group (i) in the fluorinated copolymer (a) is preferably from 10 to 60,000 groups, more preferably from 100 to 50,000 groups, further preferably from 100 to 10,000 groups, particularly preferably from 300 to 5,000 groups per $1 \times 10^6$ carbon atoms in the main chain of the fluorinated copolymer (a). When the content of the functional group (i) is at least the lower limit value of the above range, the adhesion of the fluorinated resin layer containing the fluorinated copolymer (a) to the heat resistant resin film and the metal layer will be more excellent, and when it is at most the upper limit value of the above range, a high level of adhesion to the heat resistant resin film will be obtained at a low processing temperature.

The content of the functional group (i) may be measured by means of e.g. nuclear magnetic resonance (NMR) analysis or infrared absorption spectrum analysis. For example, by means of e.g. infrared absorption spectrum analysis as disclosed in JP-A-2007-314720, the proportion (mol %) of the constituting units having the functional group (i) in all the structural units constituting the fluorinated copolymer (a) is determined, and from the proportion, the content of the functional group (i) can be calculated.

The fluorinated copolymer (a) is preferably a copolymer containing constituting units (m1) based on tetrafluoroethylene (hereinafter sometimes referred to as "TFE"), constituting units (m2) based on a cyclic hydrocarbon monomer having an acid anhydride residue and a polymerizable unsaturated bond, and constituting units (m3) based on a fluorinated monomer (excluding TFE).

Here, the acid anhydride residue in the constituting units (m2) corresponds to the functional group (i).

The fluorinated copolymer (a) may have the functional group (i) as the main chain terminal group. The functional group (i) as a main chain terminal group is preferably e.g. an alkoxycarbonyl group, a carbonate group, a hydroxy group, a carboxy group, a fluoroformyl group or an acid anhydride residue. Such a functional group may be introduced by properly selecting the radical polymerization initiator, the chain transfer agent, etc. used at the time of producing the fluorinated copolymer (a).

The cyclic hydrocarbon monomer having an acid anhydride residue and a polymerizable unsaturated bond for forming the constituting units (m2) may, for example, be itaconic anhydride (hereinafter sometimes referred to as "IAH"), citraconic anhydride (hereinafter sometimes referred to as "CAH"), 5-norbornene-2,3-dicarboxylic anhydride (hereinafter sometimes referred to as "NAH") or maleic anhydride. They may be used alone or in combination of two or more.

Among them, preferred is at least one member selected from the group consisting of IAH, CAH and NAH. In such a case, the fluorinated copolymer (a) containing an acid anhydride residue may readily be produced without employing a special polymerization method (see JP-A-11-193312) which is required when maleic anhydride is used.

Between IAH, CAH and NAH, NAH is preferred in view of more excellent adhesion to the heat resistant resin film.

The fluorinated monomer for forming the constituting units (m3) is preferably a fluorinated compound having one polymerizable double bond. It may, for example, be a fluoroolefin (excluding TFE) such as vinyl fluoride, vinylidene fluoride (hereinafter sometimes referred to as "VdF"), trifluoroethylene, chlorotrifluoroethylene (hereinafter sometimes referred to as "CTFE" or hexafluoropropylene (hereinafter sometimes referred to as "HFP"), $CF_2=CFOR^{f1}$ (wherein $R^{f1}$ is a $C_{1-10}$ perfluoroalkylene group which may contain an oxygen atom between carbon atoms), $CF_2=CFOR^{f2}SO_2X^1$ (wherein $R^{f2}$ is a $C_{1-10}$ perfluoroalkylene group which may contain an oxygen atom between carbon atoms, and $X^1$ is a halogen atom or a hydroxy group), $CF_2=CFOR^{f3}CO_2X^2$ (wherein $R^{f3}$ is a $C_{1-10}$ perfluoroalkylene group which may contain an oxygen atom between carbon atoms, and $X^2$ is a hydrogen atom or a $C_{1-3}$ alkyl group), $CF_2=CF(CF_2)_pOCF=CF_2$ (wherein p is 1 or 2), $CH_2=CX^3(CF_2)_qX^4$ (wherein $X^3$ is a hydrogen atom or a fluorine atom, q is an integer of from 2 to 10, and $X^4$ is a hydrogen atom or a fluorine atom) or perfluoro(2-methylene-4-methyl-1,3-dioxolane).

Among such fluorinated monomers, preferred is at least one member selected from the group consisting of VdF, CTFE, HFP, $CF_2=CFOR^{f1}$ and $CH_2=CX^3(CF_2)_qX^4$, more preferred is $CF_2=CFOR^{f1}$ or HFP.

$CF_2=CFOR^{f1}$ may, for example, be $CF_2=CFOCF_2CF_3$, $CF_2=CFOCF_2CF_2CF_3$, $CF_2=CFOCF_2CF_2CF_2CF_3$ or $CF_2=CFO(CF_2)_8F$, and is preferably $CF_2=CFOCF_2CF_2CF_3$ (hereinafter sometimes referred to as "PPVE").

$CH_2=CX^3(CF_2)_qX^4$ may, for example, be $CH_2=CH(CF_2)_2F$, $CH_2=CH(CF_2)_3F$, $CH_2=CH(CF_2)_4F$, $CH_2=CF(CF_2)_3H$ or $CH_2=CF(CF_2)_4H$, and is preferably $CH_2=CH(CF_2)_4F$ or $CH_2=CH(CF_2)_2F$.

The fluorinated copolymer (a) preferably comprises, based on the total molar amount of the constituting units (m1), (m2) and (m3), from 50 to 99.89 mol % of the constituting units (m1), from 0.01 to 5 mol % of the constituting units (m2) and from 0.1 to 49.99 mol % of the constituting units (m3), more preferably from 50 to 99.4 mol % of the constituting units (m1), from 0.1 to 3 mol % of the constituting units (m2) and from 0.5 to 49.9 mol % of the constituting units (m3), particularly preferably from 50 to 98.9 mol % of the constituting units (m1), from 0.1 to 2 mol % of the constituting units (m2) and from 1 to 49.9 mol % of the constituting units (m3).

When the contents of the respective constituting units are within the above ranges, the fluorinated copolymer (a) will be excellent in the heat resistance and the chemical resistance, and the fluorinated resin layer will be excellent in the coefficient of elasticity at high temperature.

Particularly when the content of the constituting units (m2) is within the above range, the amount of the acid anhydride residue in the fluorinated copolymer (a) will be appropriate, and the fluorinated resin layer will be excellent in the adhesion to the heat resistant resin film and the metal layer. Further, the after-described effect of lowering the linear expansion coefficient in high temperature region will be sufficiently obtained.

When the content of the constituting units (m3) is within the above range, the fluorinated copolymer (a) will be excellent in forming property, and the fluorinated resin layer will be more excellent in mechanical properties such as flexing resistance. The contents of the respective constituting units may be calculated by means of e.g. molten NMR analysis, fluorine content analysis and infrared absorption spectrum analysis of the fluorinated copolymer (a).

In a case where the fluorinated copolymer (a) comprises the constituting units (m1), (m2) and (m3), the content of the constituting units (m2) being 0.01 mol % based on the total molar amount of the constituting units (m1), (m2) and (m3) corresponds to a content of the acid anhydride residue being 100 residues per $1\times10^6$ carbon atoms in the main chain of the fluorinated copolymer (a). The content of the constituting units (m2) being 5 mol % based on the total molar amount of the constituting units (m1), (m2) and (m3) corresponds to a content of the acid anhydride residue in the fluorinated copolymer (a) being 50,000 residues per $1\times10^6$ carbon atoms in the main chain of the fluorinated copolymer (a).

The fluorinated copolymer (a) having the constituting units (m2) may contain constituting units based on a dicarboxylic acid (such as itaconic acid, citraconic acid, 5-norbornene-2,3-dicarboxylic acid or maleic acid) corresponding to the acid anhydride residue due to partial hydrolysis of the cyclic hydrocarbon monomer having an acid anhydride residue and a polymerizable unsaturated bond. In a case where the fluorinated copolymer (a) contains the constituting units based on the dicarboxylic acid, the content of such constituting units is included in the content of the constituting units (m2).

The fluorinated copolymer (a) may have constituting units (m4) based on a non-fluorinated monomer (excluding the cyclic hydrocarbon monomer having an acid anhydride residue and a polymerizable unsaturated bond) in addition to the above-described constituting units (m1) to (m3).

Such a non-fluorinated monomer is preferably a non-fluorinated compound having one polymerizable double bond and may, for example, be an olefin having at most 3 carbon atoms such as ethylene or propylene, or a vinyl ester such as vinyl acetate. They may be used alone or in combination of two or more. Among them, preferred is ethylene, propylene or vinyl acetate, particularly preferred is ethylene.

In a case where the fluorinated copolymer (a) has the constituting units (m4), the content of the constituting units (m4) is preferably from 5 to 90 mol %, more preferably from 5 to 80 mol %, most preferably from 10 to 65 mol % based on the total molar amount of the constituting units (m1), (m2) and (m3) being 100 mol %.

Based on the total molar amount of all the constituting units in the fluorinated copolymer (a) being 100 mol %, the total molar amount of the constituting units (m1) to (m3) is preferably at least 60 mol %, more preferably at least 65 mol %, most preferably at least 68 mol %. A preferred upper limit value is 100 mol %.

As preferred specific examples of the fluorinated copolymer (a), a TFE/PPVE/NAH copolymer, a TFE/PPVE/IAH copolymer, a TFE/PPVE/CAH copolymer, a TFE/HFP/IAH copolymer, a TFE/HFP/CAH copolymer, a TFE/VdF/IAH copolymer, a TFE/VdF/CAH copolymer, a TFE/CH$_2$=CH(CF$_2$)$_4$F/IAH/ethylene copolymer, a TFE/CH$_2$=CH(CF$_2$)$_4$F/CAH/ethylene copolymer, a TFE/CH$_2$=CH(CF$_2$)$_2$F/IAH/ethylene copolymer and a TFE/CH$_2$=CH(CF$_2$)$_2$F/CAH/ethylene copolymer may be mentioned.

The fluorinated copolymer (a) may be produced by a conventional method.

As a method for producing the fluorinated copolymer (a) having the functional group (i), for example, (1) a method of using a monomer having the functional group (i) when the fluorinated copolymer (a) is produced by a polymerization reaction, (2) a method of using a radical polymerization initiator or chain transfer agent having the functional group (i) to produce the fluorinated copolymer (a) by a polymerization reaction, (3) a method of heating a fluorinated copolymer having no functional group (i) to partially thermally decompose the fluorinated copolymer to form a reactive functional group (such as a carbonyl group) thereby to obtain the fluorinated copolymer (a) having the functional group (i), or (4) a method of graft-polymerizing a monomer having the functional group (i) to a fluorinated copolymer having no functional group (i) to introduce the functional group (i) to the fluorinated copolymer, may, for example, be mentioned. The method for producing the fluorinated copolymer (a) is particularly preferably the method (1).

As polymerization conditions, etc., for example, conditions as disclosed in JP-A-2014-224249, paragraphs [0034] to [0039] may be mentioned.

The fluorinated resin layer is one obtained by forming a composition containing the fluorinated copolymer (a). The composition may contain one type or two or more types of the fluorinated copolymer (a).

The content of the fluorinated copolymer (a) in the fluorinated resin layer (that is, the content of the fluorinated copolymer (a) in the composition containing the fluorinated copolymer (a)) is preferably at least 50 mass %, more preferably at least 80 mass % based on the total mass of the fluorinated resin layer in view of the adhesion of the fluorinated resin layer to the heat resistant resin film and the metal layer. The upper limit of the content is not particularly limited and may be 100 mass %.

The composition containing the fluorinated copolymer (a) may contain a resin other than the fluorinated copolymer (a) within a range not to impair the effects of the present invention as the case requires.

The resin other than the fluorinated copolymer (a) is not particularly limited within a range not to impair the electrical reliability. It may, for example, be a fluorinated copolymer other than the fluorinated copolymer (a), an aromatic polyester, a polyamide imide or a thermoplastic polyimide. The fluorinated copolymer other than the fluorinated copolymer (a) may, for example, be a tetrafluoroethylene/fluoroalkyl vinyl ether copolymer, a tetrafluoroethylene/hexafluoropropylene copolymer or an ethylene/tetrafluoroethylene copolymer.

The resin other than the fluorinated copolymer (a) is preferably a fluorinated copolymer (excluding the fluorinated copolymer (a)) from the viewpoint of the electrical reliability. In such a case, when such a fluorinated copolymer has a melting point of at least 280° C. and at most 320° C., excellent heat resistance will be achieved, and swelling (foaming) of the fluorinated resin layer due to heat tends to be suppressed when the after-described printed circuit board is subjected to solder reflow at high temperature or a soldering iron at high temperature is pressed against the printed circuit board.

The composition containing the fluorinated copolymer (a) preferably contains no resin other than the fluorinated copolymer, with a view to maintaining excellent electrical properties of the fluorinated resin layer, such as a low dielectric constant or low dielectric loss tangent.

The composition containing the fluorinated copolymer (a) may contain an additive within a range not to impair the effects of the present invention as the case requires.

The additive is preferably an inorganic filler having a low dielectric constant and low dielectric loss tangent. As such an inorganic filler, silica, clay, talc, calcium carbonate, mica, diatomaceous earth, alumina, zinc oxide, titanium oxide, calcium oxide, magnesium oxide, iron oxide, tin oxide, antimony oxide, calcium hydroxide, magnesium hydroxide, aluminum hydroxide, basic magnesium carbonate, magnesium carbonate, zinc carbonate, barium carbonate, dawsonite, hydrotalcite, calcium sulfate, barium sulfate, calcium silicate, montmorillonite, bentonite, activated clay, sepiolite, imogolite, sericite, glass fiber, glass beads, silica-based balloons, carbon black, carbon nanotubes, carbon nanohorn, graphite, carbon fibers, glass balloons, carbon burn, wood flour, zinc borate, etc. may be mentioned. Such inorganic fillers may be used alone, or two or more of them may be used in combination.

The inorganic filler may be porous or non-porous. It is preferably porous in that the dielectric constant or dielectric loss tangent is thereby further low.

The inorganic filler may be surface-treated with a surface treatment agent such as a silane coupling agent or a titanate coupling agent in order to improve the dispersibility in the fluorinated copolymer (a).

In a case where an inorganic filler is incorporated, the content of the inorganic filler is preferably from 0.1 to 100 parts by mass, more preferably from 0.1 to 60 parts by mass, to 100 parts by mass of the fluorinated copolymer (a).

The thickness of the fluorinated resin layer is preferably from 1 to 200 μm in the adhesive film (A2). In a case where the film is used for a flexible printed circuit board for which flexibility is required, it is preferably from 1 to 50 μm. From the viewpoint of the resistance to a soldering iron at high temperature, it is preferably from 1 to 20 μm, more preferably from 3 to 20 μm, particularly preferably from 3 to 15 μm. The thickness of the fluorinated resin layer is preferably from 3 to 3,000 μm, more preferably from 3 to 500 μm, particularly preferably from 5 to 300 μm in the case of the film (A1).

When the thickness of the fluorinated resin layer is at most the upper limit value of the above range, the thicknesses of the after-described printed circuit board material, metal laminate and printed circuit board can be made thin. When it is at most the upper limit value of the above range, the fluorinated resin layer will be excellent in heat resistance, and swelling (foaming) of the fluorinated resin layer due to heat tends to be suppressed when the after-described printed circuit board is subjected to solder reflow at high temperature or a soldering iron at high temperature is pressed against the printed circuit board. When the thickness of the fluorinated resin layer is at least the lower limit value of the above range, excellent electrical insulating properties will be achieved.

In a case where the fluorinated resin layer is provided on both side of the heat resistant resin film, the thickness of the fluorinated resin layer is the thickness on one side, not the total thickness on both sides.

In this specification, the thickness of a film or layer may be measured e.g. by a micrometer.

The fluorinated resin layer may be laminated only on one side of the heat resistant resin film, or may be laminated on both sides. With a view to suppressing warpage of the adhesive film or obtaining a double-sided metal laminate having excellent electrical reliability, it is preferred that the fluorinated resin layer is laminated on both sides of the heat resistant resin film.

In a case where the fluorinated resin layer is laminated on both sides of the heat resistant resin film, the composition (the type of the fluorinated copolymer (a), the type and the content of the optional component, etc.) and the thickness of the respective fluorinated resin layers may be the same or different. With a view to suppressing warpage of the adhesive film (A2), it is preferred that the composition and the thickness of the respective fluorinated resin layers are the same.

<Heat Resistant Resin Film>

The heat resistant resin film is a film comprising one or more heat resistant resins, and may be a single layered film or a multilayered film. However, the heat resistant resin film contains no fluorinated polymer.

In this specification, the heat resistant resin means a polymeric compound having a melting point of at least 280° C., or a polymeric compound having a highest continuous use temperature of at least 121° C. as defined in JIS C4003: 2010 (IEC 60085:2007).

As the heat resistant resin, for example, polyimide (aromatic polyimide, etc.), polyarylate, polysulfone, polyallyl sulfone (polyethersulfone, etc.), aromatic polyamide, aromatic polyether amide, polyphenylene sulfide, polyallyl ether ketone, polyamide imide, liquid crystal polyester, etc. may be mentioned.

The heat resistant resin film may be produced, for example, by a method of forming a heat resistant resin or a resin composition containing a heat resistant resin by a known forming method (such as casting, extrusion or blown-film extrusion). As the heat resistant resin film, a commercial product may be used. The surface of the heat resistant resin film, for example, the surface to be laminated with a fluororesin layer, may be subjected to surface treatment. The method for such surface treatment is not particularly limited, and may suitably be selected for use from among known methods such as corona discharge treatment, plasma treatment, etc.

As the heat resistant resin film, a polyimide film is preferred. A polyimide film is a film composed of a polyimide. The polyimide film may contain an additive, as the case requires, within a range not to impair the effects of the present invention.

The polyimide constituting the polyimide film is not particularly limited. It may be either a polyimide having no thermoplasticity or a thermoplastic polyimide. The polyimide may, for example, be preferably an aromatic polyimide. Particularly preferred is a wholly aromatic polyimide produced by condensation polymerization of an aromatic polyvalent carboxylic acid dianhydride and an aromatic diamine.

The polyimide is usually obtained by a reaction (polycondensation) of a polyvalent carboxylic acid dianhydride (or its derivative) and a diamine via a polyamic acid (polyimide precursor).

A polyimide, particularly an aromatic polyimide, is insoluble in a solvent or the like due to its rigid main chain structure and is infusible. Accordingly, first, by the reaction of a polyvalent carboxylic acid dianhydride and a diamine, a polyimide precursor (polyamic acid or a polyamide acid) soluble in an organic solvent is prepared, and forming is conducted by various methods at this polyamic acid stage. Then, the polyamic acid is dehydrated by heating or by a chemical method and cyclized (imidized) to obtain a polyimide.

As specific examples of the aromatic polyvalent carboxylic acid dianhydride, for example, ones disclosed in JP-A-2012-145676, paragraph [0055] may be mentioned.

As specific examples of the aromatic diamine, for example, ones disclosed in JP-A-2012-145676, paragraph [0057] may be mentioned.

The additive which the polyimide film may contain is preferably an inorganic filler having a low dielectric constant or low dielectric loss tangent. As such an inorganic filler, fillers mentioned for the composition containing the fluorinated copolymer (a) may be mentioned. Such inorganic fillers may be used alone, or two or more of them may be used in combination.

The inorganic filler may be porous or non-porous. It is preferably porous in that the dielectric constant or dielectric loss tangent is thereby further low.

The inorganic filler may be surface-treated with a surface treatment agent such as a silane coupling agent or a titanate coupling agent in order to improve the dispersability in the polyimide.

In a case where an inorganic filler is contained, the content of the inorganic filler in the polyimide film is preferably from 0.1 to 100 mass %, more preferably from 0.1 to 60 mass %, based on the polyimide.

The thickness of the heat resistant resin film is preferably from 3 to 2,500 μm, and in a case where the film is used for a flexible printed circuit board for which flexibility is required, it is preferably from 3 to 50 μm, more preferably from 5 to 25 μm, particularly preferably from 6 to 25 μm. When the thickness of the heat resistant resin film is at least the lower limit value of the above range, excellent electrical insulating property will be achieved, and when it is at most the upper limit value of the above range, the total thickness of the adhesive film (A2) can be made thin.

In the adhesive film (A2), the thickness of the heat resistant resin film is preferably thicker than the thickness of the fluorinated resin layer. That is, the thickness of the fluorinated resin layer is preferably thinner than the thickness of the heat resistant resin film, whereby swelling (foaming) of the fluorinated resin layer due to heat can be more effectively suppressed when the after-described printed circuit board is subjected to solder reflow at high temperature or a soldering iron at high temperature is pressed against the printed circuit board.

The thickness of the heat resistant resin film is preferably more than one time, more preferably at least 1.25 times and at most 25 times, particularly preferably at least 1.66 times and at most 8.3 times the thickness of the fluorinated resin layer.

<Thickness of and Method for Producing Film (A1)>

The thickness of the film (A1) is the thickness of the fluorinated resin layer, and is preferably within the above range. The film (A1) may be produced by a conventional method. For example, the fluorinated copolymer (a) as it is or a resin composition obtained by kneading the fluorinated copolymer (a) and another component used as the case requires, is formed into a film by a known forming method such as extrusion or blown-film extrusion, thereby to obtain a fluorinated resin film.

<Thickness of and Method for Producing Adhesive Film (A2)>

The entire thickness of the adhesive film (A2) is preferably at most 3,000 μm, and is preferably at most 100 μm in a case where the film is used for a flexible printed circuit board for which flexibility is required. Particularly to applications for which high flexibility is required, it is preferably from 5 to 50 μm. The thinner the entire thickness of the adhesive film (A2), the more the flexibility improves, and the lighter the mass per unit area.

The adhesive film (A2) may be produced by laminating the fluorinated resin layer on one side or on both sides of the heat resistant resin film. The fluorinated resin layer has adhesion due to the functional group (i). Accordingly, the fluorinated resin layer can be directly laminated on the heat resistant resin film without using an adhesive.

The method of laminating the fluorinated resin layer is not particularly limited so long as the heat resistant resin film and the fluorinated resin layer can be directly laminated, however a heat lamination method or an extrusion lamination method is preferred with a view to improving the electrical properties and the heat resistance of the adhesive film (A2).

By heat lamination method, a preliminarily formed fluorinated resin film and a heat resistant resin film are overlaid and hot-pressed to laminate these films.

By extrusion lamination method, the fluorinated copolymer (a) or a composition containing it is melted and extruded into a film, which is laminated on the heat resistant resin film.

Forming of the fluorinated resin film may be carried out by the above conventional method.

The surface of the fluorinated resin film, for example, the surface to be laminated on the heat resistant resin film, may be surface-treated. The surface treatment method is not particularly limited and may be properly selected from among known surface treatment methods such as corona discharge treatment and plasma treatment.

As the hot press conditions in the heat lamination method, the temperature is preferably from 295 to 420° C., more preferably from 300 to 400° C. The pressure is preferably from 0.3 to 30 MPa, more preferably from 0.5 to 20 MPa, most preferably from 1 to 10 MPa. The time is preferably from 3 to 240 minutes, more preferably from 5 to 120 minutes, most preferably from 10 to 80 minutes. The hot press may be carried out by using a pressing plate or a roll. The pressing plate is preferably a stainless steel plate.

(Step (I))

The step (I) is a step of subjecting the film (A) to a heat treatment to obtain a material for a printed circuit board.

In the step (I), the heat treatment is carried out so that the ratio of MFR (II) to MRF (I) [MFR (II)/MFR (I)] is from 0.05 to 0.5 and that MFR (II) is at most 15 g/10 min, where MFR (I) is MFR of the fluorinated resin layer of the film (A) before the heat treatment, and MFR (II) is MFR of the fluorinated resin layer after the heat treatment. Further, the heat treatment temperature is a temperature of at least 250° C. and lower by at least 5° C. than the melting point of the fluorinated copolymer (a).

A printed circuit board formed of such a material for a printed circuit board obtained by subjecting the film (A) to a heat treatment, is less likely to be deformed and is hardly warped at the time of solder reflow at high temperature or when a soldering iron at high temperature is pressed against the printed circuit board. The reason is considered to be as follows. That is, by subjecting the film (A) to a heat treatment, the rigidity of the fluorinated resin layer of the film (A) improves, and the linear expansion coefficient of the fluorinated resin layer decreases. As a result, the difference in the linear expansion coefficient between the fluorinated resin layer and the after-described metal layer in the printed circuit board is reduced, and deformation such as warpage particularly in a high temperature region (from 150 to 200° C.) decreases. Further, it is also found that the storage elastic modulus of the fluorinated resin layer of the film (A) also tends to improve. The storage elastic modulus is an index for the rigidity, and a fluorinated resin layer having a high storage elastic modulus is considered to be less likely to have deformation such as warpage.

Further, in recent years, use of the printed circuit board in an environment at a temperature higher than 150° C. is sometimes assumed. For example, WO2011/077917 discloses that a flexible printed circuit board used for an on-vehicle electronic device is repeatedly exposed to high temperature environment of about 150° C. Further, a device other than an on-vehicle electronic device, for example, a notebook personal computer or a super computer having a CPU (Central Processing Unit) capable of high speed treatment, employs a flexible printed circuit board for further downsizing and weight reduction. In such a device also, by heat generated from the CPU, the flexible printed circuit board is repeatedly exposed to high temperature environment. Whereas, by subjecting the film (A) to a heat treatment as described above, the linear expansion coefficient of the fluorinated resin layer in the film (A) is decreased, and the difference in the linear expansion coefficient between the fluorinated resin layer and the after-described metal layer can be reduced. Accordingly, even when the printed circuit board is used for such an application, deformation such as warpage of the printed circuit board due to a difference in the linear expansion coefficient between the fluorinated resin layer and the metal layer can be suppressed.

In the step (I), the heat treatment is carried out so that [MFR (II)/MFR (I)] is preferably from 0.05 to 0.4, more preferably from 0.05 to 0.35, particularly preferably from 0.1 to 0.3. When [MFR (II)/MFR (I)] is within the above range, the heat treatment may be moderately carried out, and the linear expansion coefficient of the fluorinated resin layer can be sufficiently decreased. Further, the storage elastic modulus of the fluorinated resin layer tends to further increase. When [MFR (II)/MFR (I)] is higher than the upper limit value of the above range, the heat treatment may be insufficient, and if it is less than the lower limit value of the above range, heat deterioration (e.g. decomposition of the fluorinated resin layer) will proceed.

In the step (I), the heat treatment is carried out so that MFR (II) satisfies preferably at most 15 g/10 min, more preferably at most 10 g/10 min, particularly preferably at most 5 g/10 min. When MFR (II) is at most the upper limit value of the above range, the linear expansion coefficient of the fluorinated resin layer will be sufficiently decreased.

Further, in the step (I), the heat treatment is carried out so that MFR (II) satisfies preferably at least 0.5 g/10 min, more preferably at least 1 g/10 min, particularly preferably at least 1.5 g/10 min. When MFR (II) is at least the above lower limit value, excellent processability will be achieved when the metal layer is directly laminated on the fluorinated resin layer in the after-described step (II).

In a case where the film (A) is the film (A1), the storage elastic modulus of the obtained material for a printed circuit board (that is, the film (A1) after the heat treatment) is preferably at least 650 MPa, more preferably at least 800 MPa, particularly preferably at least 900 MPa. Further, the storage elastic modulus is preferably at most 5,000 MPa, more preferably at most 2,000 MPa, particularly preferably at most 1,500 MPa. When the storage elastic modulus is at least the above lower limit value, the rigidity of the material for a printed circuit board will be more excellent, and the linear expansion coefficient tends to further decrease. When the storage elastic modulus is at most the above upper limit value, such is useful for application to a flexible printed circuit board for which flexibility is required.

In the material for a printed circuit board thus produced, the functional groups (i) contained in the fluorinated resin layer are reduced via the heat treatment in the step (I) but remain.

That is, the produced material for a printed circuit board (fluorinated resin layer) comprises a composition containing the fluorinated copolymer having the functional group (i) and has a melt flow rate of at most 15 g/10 min measured at 372° C. under a load of 49 N. Further, the storage elastic modulus of the fluorinated resin layer in the produced material for a printed circuit board is usually at least 650 MPa by the heat treatment, preferably at least 800 MPa, more preferably at least 900 MPa.

In this specification, the storage elastic modulus is a storage elastic modulus measured by using a dynamic viscoelasticity apparatus "DMS6100" (manufactured by Seiko Instruments Inc.) at a temperature-increasing rate of 2° C./min at tensile mode under a frequency of 1 Hz at 23° C.

In a case where the film (A) is the above-described adhesive film (A2), the linear expansion coefficient of the obtained material for a printed circuit board (that is, the adhesive film (A2) after the heat treatment) at from 150 to 200° C. is preferably from 0 to 25 ppm/° C., more preferably from 10 to 23 ppm/° C. When the linear expansion coefficient at a high temperature region is at most the above upper limit value, the above-described deformation such as warpage can be further decreased. Further, a material for a printed circuit board having a linear expansion coefficient of at least the above lower limit value will readily be obtained by the above heat treatment.

In the material for a printed circuit board thus produced, the functional groups (i) contained in the fluorinated resin layer are reduced via the heat treatment in the step (I) but remain.

That is, the fluorinated resin layer in the produced material for a printed circuit board (a laminate of the heat resistant resin film and the fluorinated resin layer) comprises a composition containing the fluorinated copolymer having the functional group (i) and has a melt flow rate of at most 15 g/10 min measured at 372° C. under a load of 49 N. Further, the linear expansion coefficient of the produced material for a printed circuit board at from 150 to 200° C. is usually from 0 to 25 ppm/° C. by the heat treatment, preferably from 10 to 23 ppm/° C.

In this specification, the linear expansion coefficient is a value measured by a thermo-mechanical analyzer manufactured by SII Nanotechnology Inc. (TMA/SS6100) with respect to a sample cut in a strip form of 4 mm×50 mm and dried in an oven at 250° C. for 2 hours for conditioning. Specifically, the sample is heated at a rate of 5° C./min from 30° C. to 250° C. while a load of 2.5 g is applied in the air atmosphere with a distance between chucks of 20 mm, and a change due to linear expansion of the sample is measured. After completion of the measurement, in a case where the linear expansion coefficient at from 150 to 200° C. is to be obtained, the linear expansion coefficient (ppm/° C.) at from 150 to 200° C. is obtained from a change of the sample at from 150 to 200° C.

[MFR (II)/MFR (I)] and MFR (II) may be controlled e.g. by a method of adjusting the heat treatment temperature in the step (I), a method of adjusting the heat treatment time, or a combination thereof.

The heat treatment temperature is a temperature of at least 250° C. and lower by at least 5° C. than the melting point of the fluorinated copolymer (a) and is a temperature so that [MFR (II)/MFR (I)] and MFR (II) are within the above ranges, and is preferably a temperature of at least 260° C. and lower by at least 5° C. than the melting point of the fluorinated copolymer (a). When the heat treatment temperature is at least the lower limit value of the above range, the heat treatment can be conducted in a short time, thus leading to excellent productivity of the material for a printed circuit board. When it is at most the upper limit value of the above range, heat deterioration (e.g. decomposition of the fluorinated resin layer) of the material for a printed circuit board can be suppressed.

The heat treatment time is preferably for example from 1 to 360 hours, more preferably from 3 to 336 hours, particularly preferably from 6 to 192 hours.

The heat treatment equipment is not particularly limited and may, for example, be a circulating hot air dryer, a wicket dryer, a tunnel dryer or an infrared dryer.

(Step (II))

The step (II) is a step of directly laminating a metal layer on the fluorinated resin layer of the film (A1) or the adhesive film (A2) of the material for a printed circuit board obtained in the step (I) to obtain a metal laminate. The fluorinated resin layer has adhesion derived from the functional group (I). Accordingly, the metal layer can be directly laminated on the fluorinated resin layer without using an adhesive.

In a case where the material for a printed circuit board is produced from the adhesive film (A2) and has the heat resistant resin film and the fluorinated resin layer laminated on both sides of the heat resistant resin film, the metal layer may be laminated on one of the fluorinated resin layers or may be laminated on both the fluorinated resin layers.

The metal layer is not particularly limited and may be properly selected depending upon the application. In a case where the after-described printed circuit board is used for electronic equipment or electrical apparatus for example, the metal layer may, for example, be a metal foil of copper or a copper alloy, stainless steel or its alloy, nickel or a nickel alloy (including 42 alloy), aluminum or an aluminum alloy. For a conventional printed circuit board commonly used in such applications, a copper foil such as a rolled copper foil or an electrolytic copper foil is widely used as the metal layer and may be preferably used also in the present invention.

On the surface of the metal layer, an anticorrosive layer (for example, an oxide coating film of e.g. chromate) or a heat resistant layer may be formed. Further, for the purpose of improving the adhesion to the fluorinated resin layer, a treatment with a coupling agent may be applied to the surface of the metal layer.

The thickness of the metal layer is not particularly limited so long as a sufficient function can be exhibited depending upon the application of the printed circuit board.

The metal laminate may be produced by bonding and directly laminating a metal foil for forming the metal layer on the fluorinated resin layer.

Bonding of the fluorinated resin layer and the metal foil may be conducted by a known method. For example, the fluorinated resin layer and the metal foil may be bonded by continuous treatment by a heated roller laminator having at least one pair of metal rollers or a double belt press (DBP). In view of simple apparatus constitution and advantages in the maintenance cost, bonding of the fluorinated resin layer and the metal foil is carried out preferably by heat lamination using a heated roller laminator having at least one pair of metal rollers.

The "heated roller laminator having at least one pair of metal rollers" is an apparatus having metal rollers for heating and pressurizing the material, and its specific apparatus structure is not particularly limited.

The specific structure of a means to conduct the heat lamination is not particularly limited, however, to achieve a favorable appearance of the obtainable metal laminate, it is preferred to dispose a protective material between the surface to be pressurized and the metal foil.

The protective material is not particularly limited so long as it withstands the heating temperature in the heat lamination step, and is preferably a heat resistant plastic film of e.g. a non-thermoplastic polyimide or a metal foil such as a copper foil, an aluminum foil or a SUS foil. Particularly, a non-thermoplastic polyimide film is more preferred in view of excellent balance between the heat resistance, the recyclability, etc. Further, the thickness of the non-thermoplastic polyimide film is preferably at least 75 μm, since if it is too thin, the protective material may not sufficiently fulfill the role as a buffer and a protector at the time of lamination. The protective material is not necessarily a single layer and may have a multilayer structure of two or more layers differing in the properties.

The method of heating the materials to be laminated (that is, the film (A1) or the adhesive film (A2) and the metal foil for forming the metal layer) in the above heat lamination means is not particularly limited, and for example, a known heating means capable of heating at a predetermined temperature, such as a circulating hot air method, a hot air heating method or an induction heating method may be employed. Likewise, the method of pressurizing the materials to be laminated in the heat lamination means is not particularly limited, and for example, a known pressurizing means capable of applying predetermined pressure, such as a hydraulic method, a pneumatic method or a pressurization method between gaps may be employed.

The heating temperature in the heat lamination step, that is, the lamination temperature, is preferably a temperature of the glass transition temperature (Tg) of the fluorinated resin layer+50° C. or higher, more preferably Tg of the fluorinated resin layer+100° C. or higher. When it is a temperature of Tg+50° C. or higher, the fluorinated resin layer and the metal layer may be favorably heat-laminated. Further, when it is a temperature of Tg+100° C. or higher, the lamination rate may be increased, thus further improving the productivity.

Tg of the fluorinated resin layer means Tg of the resin constituting the fluorinated resin layer (that is, the fluorinated copolymer (a) or a composition containing the fluorinated copolymer (a)).

Further, the lamination temperature is preferably at most 420° C., more preferably at most 400° C. The fluorinated resin layer formed on one of or both sides of the heat resistant resin film of the adhesive film (A2) has adhesion to the metal layer. Accordingly, the heat lamination can be carried out at low temperature. Therefore, it is possible to suppress dimensional changes which occur when wirings are formed by etching or solder reflow is conducted for mounting the members, due to residual strain formed on the metal laminate by the high temperature during the heat lamination.

The lamination rate in the heat lamination step is preferably at least 0.5 m/min, more preferably at least 1.0 m/min. When it is at least 0.5 m/min, sufficient heat lamination can be carried out, and when it is at least 1.0 m/min, the productivity will further improve.

The higher the pressure in the heat lamination step, that is, the lamination pressure, the lower the lamination temperature can be made, and the higher the lamination rate can be made. However, if the lamination pressure is too high, usually the dimensional changes of the obtainable metal laminate tend to be significant. Further, on the contrary, if the lamination pressure is too low, the adhesive strength of the metal layer of the obtainable metal laminate tends to be low. Accordingly, the lamination pressure is preferably within a range of from 49 to 490 N/cm (from 5 to 50 kgf/cm), more preferably from 98 to 294 N/cm (from 10 to 30 kgf/cm). Within such a range, three conditions i.e. the lamination temperature, the lamination rate and the lamination pressure will be favorable, and the productivity will further improve.

The tensile force of the film (A) in the lamination step is preferably from 0.01 to 4 N/cm, more preferably from 0.02 to 2.5 N/cm, particularly preferably from 0.05 to 1.5 N/cm. If the tensile force is lower than the above range, sagging or meandering may occur during transport of the laminate, and the laminate may not be uniformly fed into the heated rollers, whereby a metal laminate with a favorable appearance may hardly be obtained. On the other hand, if the tensile force is higher than the above range, the influence of the tensile force tends to be significant, and the dimensional stability may be deteriorated.

In the step (II), it is preferred to use a heat lamination apparatus of continuously heating and pressure-bonding the materials to be laminated, such as the heated roller laminate or having at least one pair of metal rollers. In such a heat lamination apparatus, at a stage prior to the heat lamination means (e.g. at least one pair of metal rollers), a material supplying means of supplying the materials to be laminated may be provided, or at a stage after the heat lamination means, a material winding means of winding the materials to be laminated may be provided. By such means, the productivity of the heat lamination apparatus will further improve. Specific structures of the material supplying means and the material winding means are not particularly limited, and for example, a known roll winding machine capable of winding the film (A) or the metal layer, or the obtainable metal laminate may, for example, be mentioned.

Further, it is more preferred to provide a protective material winding means or a protective material supplying means of winding or supplying the protective material. When such a protective material winding means or a protective material supplying means is provided, the protective material once used in the heat lamination step can be wound and supplied again and can thereby be recycled. Further, in order to arrange the both ends of the protective material when wound, an end position detecting means and a winding position correcting means may be provided. By such means, the protective material can be wound while the ends of the protective material can be arranged precisely, whereby the recycle efficiency can be improved. Specific structures of such a protective material winding means, a protective material supplying means, an end position detecting means and a winding position correcting means are not particularly limited, and known apparatus may be used.

(Step (III))

The step (III) is a step of etching the metal layer of the metal laminate obtained in the step (II) to form a patterned circuit to obtain a printed circuit board.

The etching may be carried out, for example, by a conventional method such as chemical etching (wet etching) of using an etching liquid such as an acidic solution such as a copper chloride solution or nitric acid; or an alkali solution.

The obtained printed substrate may be used as a flexible printed circuit board when a flexible film (A) is used.

(Step (IV))

The step (IV) is a step of soldering the patterned circuit of the printed circuit board obtained in the step (III) using a soldering iron.

The step (IV) may be a step of placing only solder for example in a spherical form on the patterned circuit, or may be a step of mounting e.g. an electronic member together with solder.

The printed circuit board obtained in the step (III) is one produced via the above step (I), and the fluorinated resin layer in the printed circuit board has a low linear expansion coefficient. Accordingly, even when a soldering iron at high temperature is pressed against the printed circuit board in the step (IV), the printed circuit board is less likely to be warped.

Second Embodiment

According to a second embodiment of the present invention, the present invention provides a method for producing a metal laminate, which comprises subjecting a metal laminate precursor to a heat treatment to obtain a metal laminate.

The metal laminate precursor is a laminate having the adhesive film (A2) described in the first embodiment and a metal layer directly laminated on at least one fluorinated resin layer of the adhesive film (A2).

In the second embodiment, the heat treatment is carried out at a temperature of at least 250° C. and lower by at least 5° C. than the melting point of the fluorinated copolymer (a) so that the ratio of MFR (VI) to MFR (V) [MFR (VI)/MFR (V)] is from 0.05 to 0.5 and that MFR (VI) is at most 15 g/10 min, where MFR (V) is MFR of the fluorinated resin layer before the heat treatment, and MFR (VI) is MFR of the fluorinated resin layer after the heat treatment.

The production method according to the second embodiment may comprise, after the metal laminate is produced by a step of subjecting the metal laminate precursor to a heat treatment (hereinafter sometimes referred to as step (V)), a step of etching the metal layer of the metal laminate to form a patterned circuit thereby to produce a printed circuit board (hereinafter sometimes referred to as step (VI)) and a step of soldering the formed patterned circuit by a soldering iron (hereinafter sometimes referred to as a step (VII)).

(Metal Laminate Precursor)

The metal laminate precursor is a plate comprising the adhesive film (A2) and a metal layer directly laminated on at least one fluorinated resin layer of the adhesive film (A2).

The structure, the production method, etc. of the adhesive film (A2) are as described in the first embodiment.

The structure, etc. of the metal layer are as described in the step (II) in the first embodiment.

In production of the metal laminate precursor, a specific method of directly laminating a metal layer on at least one fluorinated resin layer of the adhesive film (A2), as described in the step (II) in the first embodiment, a known bonding means using, for example, a heated roller laminator having at least one pair of metal rollers or a double belt press (DBP) may be mentioned. Further, in a case where the adhesive film (A2) has a fluorinated resin layer on both sides thereof, the metal layer may be laminated on one of the fluorinated resin layers or may be laminated on both the fluorinated resin layers.

(Step (V))

The step (V) is a step of subjecting the metal laminate precursor to a heat treatment to obtain a metal laminate.

In the step (V), the heat treatment is carried out so that the ratio of MFR (VI) to MFR (V) [MFR (VI)/MFR (V)] is from 0.05 to 0.5 and that MFR (VI) is at most 15 g/10 min, where MFR (V) is MFR of the fluorinated resin layer which the metal laminate precursor before the heat treatment has, and MFR (VI) is MFR of the fluorinated resin layer after the heat treatment. Further, the heat treatment temperature is a temperature of at least 250° C. and lower by at least 5° C. than the melting point of the fluorinated copolymer (a).

Such a printed circuit board provided with a metal laminate obtained by subjecting the metal laminate precursor to a heat treatment is less likely to be deformed and is hardly warped, at the time of solder reflow at high temperature or when a soldering iron at high temperature is pressed against the printed circuit board. The reason is considered to be as follows. That is, by subjecting the metal laminate precursor to a heat treatment, the rigidity of the fluorinated resin layer of the adhesive film (A2) constituting the metal laminate precursor improves, and the linear expansion coefficient of the fluorinated resin layer decreases. As a result, in the printed circuit board, the difference in the linear expansion coefficient between the fluorinated resin layer and the metal layer is reduced, and deformation such as warpage particularly in a high temperature region (from 150 to 200° C.) decreases. Further, it was further found that by the heat treatment, the storage elastic modulus of the fluorinated resin layer of the adhesive film (A2) also tends to improve. The storage elastic modulus is an index for the rigidity as described above, and a fluorinated resin layer having a high storage elastic modulus is considered to be less likely to have deformation such as warpage.

Further, as described above, in recent years, use of the printed circuit board in an environment at a temperature higher than 150° C. is sometimes assumed. By subjecting the metal laminate precursor to a heat treatment as described above, the linear expansion coefficient of the fluorinated resin layer of the adhesive film (A2) constituting the metal laminate precursor can be decreased, and the difference in the linear expansion coefficient between the fluorinated resin layer and the metal layer can be reduced. Accordingly, even when a printed circuit board is used for such applications, as described above, deformation such as warpage of a printed circuit board due to a difference in the linear expansion coefficient between the fluorinated resin layer and the metal layer can be suppressed.

In the step (V), the heat treatment is carried out so that [MFR (VI)/MFR (V)] is preferably from 0.05 to 0.4, more preferably from 0.05 to 0.35, particularly preferably from 0.1 to 0.3. When [MFR (VI)/MFR (V)] is within the above range, the heat treatment is moderately carried out, and the linear expansion coefficient of the fluorinated resin layer can be sufficiently decreased. Further, the storage elastic modulus of the fluorinated resin layer tends to further increase. If [MFR (VI)/MFR (V)] exceeds the upper limit value of the above range, the heat treatment tends to be insufficient, and if it is less than the lower limit value of the above range, heat deterioration (such as decomposition of the fluorinated resin layer) will proceed.

In the step (V), the heat treatment is carried out so that MFR (VI) is preferably at most 15 g/10 min, more preferably at most 10 g/10 min, particularly preferably at most 5 g/10 min. When MFR (VI) is at most the above upper limit value, the linear expansion coefficient of the fluorinated resin layer will be sufficiently decreased.

Further, MFR (VI) may be 0 g/10 min by the heat treatment in the step (V), however, the heat treatment is preferably carried out so that MFR (V) is at least 0.5 g/10 min, more preferably at least 1.0 g/10 min, particularly preferably at least 1.5 g/10 min, in that melt processing such as hot press is further carried out to prepare a multilayer circuit board.

The linear expansion coefficient of the adhesive film in the obtained metal laminate at from 150 to 200° C. is preferably from 0 to 25 ppm/° C., more preferably from 10 to 23 ppm/° C. When the linear expansion coefficient in a high temperature region is at most the above upper limit value, the warpage can be further suppressed. Further, a metal laminate having an adhesive film having a linear expansion coefficient of at least the above lower limit value will readily be obtained by the above heat treatment.

In the metal laminate thus produced, the functional groups (i) contained in the fluorinated resin layer are reduced via the heat treatment in the step (V) but remain. That is, the fluorinated resin layer in the produced metal laminate (a laminate of the heat resistant resin film, the fluorinated resin layer and the metal layer) comprises a composition containing a fluorinated copolymer having the functional group (i) and has a melt flow rate of at most 15 g/10 min measured at 372° C. under a load of 49 N. Further, the linear expansion coefficient of the adhesive film (a laminate of the heat resistant resin film and the fluorinated resin layer) in the produced metal laminate at from 150 to 200° C. becomes usually from 0 to 25 ppm/° C., preferably from 10 to 23 ppm/° C., by the heat treatment.

[MFR (VI)/MFR (V)] and MFR (VI) may be controlled e.g. by a method of adjusting the heat treatment temperature in the step (V), a method of adjusting the heat treatment time, or a combination thereof.

The heat treatment temperature is a temperature of at least 250° C. and lower by at least 5° C. than the melting point of the fluorinated copolymer (a) and is a temperature so that [MFR (VI)/MFR (V)] and MFR (VI) are within the above ranges, and is preferably a temperature of at least 260° C. and lower by at least 5° C. than the melting point of the fluorinated copolymer (a). When the heat treatment temperature is at least the lower limit value of the above range, the heat treatment can be conducted in a short time, thus leading to an excellent productivity of the metal laminate. When it is at most the upper limit value of the above range, heat deterioration (e.g. decomposition of the fluorinated resin layer) of the metal laminate can be suppressed.

The heat treatment time is preferably from 1 to 360 hours for example, more preferably from 3 to 336 hours, particularly preferably from 6 to 192 hours.

The heat treatment equipment is not particularly limited and may, for example, be a circulating hot air dryer, a wicket dryer, a tunnel dryer or an infrared dryer.

(Step (VI) and Step (VII))

The step (VI) is a step of etching the metal layer of the metal laminate obtained in the step (V) to form a patterned circuit to obtain a printed circuit board.

The step (VII) is a step of soldering the patterned circuit board of the printed circuit board obtained in the step (VI) by using a soldering iron.

The step (VI) may be carried out in the same manner as the step (III) in the first embodiment, and the step (VII) may be carried out in the same manner as the step (IV) in the first embodiment.

The printed circuit board thus obtained may be used as a flexible printed circuit board when it is produced by using a flexible adhesive film (A2).

Advantageous Effects

In the first and second embodiments, the fluorinated resin layer contains the fluorinated copolymer (a) having a functional group (i) and is favorably attached to the heat resistant resin film and the metal layer. Accordingly, the fluorinated resin layer functions as an adhesive layer and is capable of laminating the heat resistant resin film and the metal layer without using an adhesive such as a thermosetting adhesive.

Further, since the fluorinated resin layer is used as the adhesive layer, excellent heat resistance, flexibility, electrical reliability, etc. are achieved as compared with a case where a thermosetting adhesive is used for the adhesive layer.

Further, the fluorinated copolymer (a) has low dielectric properties (such as a dielectric constant and a dielectric loss tangent) and is excellent in the electrical properties as compared with a thermoplastic polyimide. Accordingly, by the fluorinated resin layer containing the fluorinated copolymer (a) being directly laminated on the metal layer, a printed circuit board having a high signal transmission rate and a low transmission loss can be obtained.

Further, in the first embodiment, the object to be heat-treated in the step (I) is the film (A), and in the second embodiment, the object to be heat-treated in the step (V) is the metal laminate precursor, and both the film (A) and the metal laminate precursor which are objects to be heat-treated have the fluorinated resin layer. It is considered that since the fluorinated resin layer contains the fluorinated copolymer (a) having a functional group (i), by heat-treating the object to be heat-treated, a crosslinked structure is formed between molecules and in the molecules of the fluorinated copolymer (a), the decomposition reaction of the main chain of the fluorinated copolymer (a) and brittleness of the fluorinated resin layer due to the decomposition reaction are suppressed. Accordingly, it is estimated that the linear expansion coefficient of the material for a printed circuit board in a high temperature region in the first embodiment and the linear expansion coefficient of the adhesive film (A2) which the metal laminate has in a high temperature region in the second embodiment are reduced. It is estimated that the crosslinked structure is formed as a result of intramolecular and intermolecular covalent bonds formed by active radicals generated from the functional group (i) by heat. If a layer containing a fluorinated copolymer having no functional group (i) is heat-treated, a crosslinked structure is hardly formed. Accordingly, it is considered that the decomposition reaction of the main chain proceeds by priority over the crosslinking reaction, and the linear expansion coefficient in a high temperature region is less likely to be reduced.

Further, in the first embodiment, the heat treatment (step (I)) is carried out on the film (A) before the metal layer is laminated. In such a case, even when the adhesive film (A2) comprising the heat resistant resin film is used as the film (A) and the heat resistant resin film contains moisture in a large amount due to its moisture absorption property, the moisture will be smoothly removed from the heat resistant resin film and the fluorinated resin layer during the heat treatment (step (I)). Accordingly, an effect such that bubbling due to moisture hardly occurs at the time of solder reflow of the printed circuit board at high temperature or when a soldering iron at high temperature is pressed against the printed circuit board.

Whereas in the second embodiment, the heat treatment (step (V)) is carried out on the metal laminate precursor having the metal layer laminated on the adhesive film (A2). In such a case, although the reason is not clearly understood, the effect of reducing the linear expansion coefficient in a high temperature region is higher than in a case where the heat treatment is conducted on the film (A2) before the metal layer is laminated as in the first embodiment.

EXAMPLES

Now, the present invention will be described in further detail with reference to Examples of the present invention, however, it should be understood that the present invention is by no means restricted thereto.

Ex. 1, 3, 5, 6, 7 to 13 are Examples of the present invention, and Ex. 2, 4, 14 to 16 are Comparative Examples.
<Evaluation Methods>

Measurements, tests and evaluations were conducted by the following methods.
(1) Copolymer Composition The copolymer composition of the fluorinated copolymer (a) was calculated from data measured by molten NMR analysis, fluorine content analysis and infrared absorption spectrum analysis.

(2) Content of Functional Group (i)

The proportion of constituting units based on NAH having a functional group (i) in the fluorinated copolymer (a) was obtained as follows.

The fluorinated copolymer (a) was pressed to obtain a film having a thickness of 200 μm. In the infrared absorption spectrum, the absorption peak of the constituting unit based on NAH in the fluorinated copolymer appears at 1,778 $cm^{-1}$ in each case. By measuring the absorbance of the absorption peak, and using the molar extinction coefficient of NAH being 20,810 $mol^{-1} \cdot l \cdot cm^{-1}$, the proportion (mol %) of the constituting units based on NAH was obtained.

The number of the reactive functional groups (acid anhydride residues) per $1 \times 10^6$ carbon atoms in the main chain is calculated to be $[a \times 10^6/100]$ groups, where a (mol %) is the above proportion.
(3) Melting Point Using a differential scanning calorimeter (manufactured by Seiko Instruments & Electronics Ltd., DSC apparatus), the melting peak at the time of heating the fluorinated copolymer (a) at a rate of 10° C./min was recorded, and the temperature (° C.) corresponding to the maximum value was taken as the melting point.
(4) MFR Using a melt indexer (manufactured by TECHNOL SEVEN CO., LTD.), the mass (g) of the fluorinated copolymer (a) flowing out from a nozzle with a diameter of 2 mm and a length of 8 mm in 10 minutes (unit time) at 372° C. under a load of 49 N, was measured.
(5) Linear Expansion Coefficient (ppm/° C.)

A sample cut into a strip of 4 mm×55 mm was dried in an oven at 250° C. for 2 hours for conditioning, followed by measurement using a thermo-mechanical analyzer (manufactured by SII Nanotechnology Inc., TMA/SS6100). Specifically, the sample was heated from 30° C. to 250° C. at a rate of 5° C./min in the air with a distance between chucks of 20 mm while a load of 2.5 g was applied, and a change due to linear expansion of the sample was measured. After the measurement, the linear expansion coefficient at from 50 to 100° C. was obtained from a change of the sample from 50° C. to 100° C., the linear expansion coefficient at from 100 to 150° C. was obtained from a change of the sample from 100° C. to 150° C., and the linear expansion coefficient at from 150 to 200° C. was obtained from a change of the sample from 150° C. to 200° C.
(6) Relative Dielectric Constant With respect to each of adhesive films in Ex. 3 and 4 described hereinafter, the relative dielectric constants at frequencies of 2.5 GHz, 10 GHz and 20 GHz were obtained by the split post dielectric resonator method (SPDR method) at 23° C. under 50% RH. Equipment used in the measurement were nominal fundamental frequency of 2.5 GHz type split post dielectric resonator manufactured by QWED Company, vector network analyzer E8361C manufactured by Keysite Technologies and 85071E option 300 relative dielectric constant calculation software manufactured by Keysite Technologies.
(7) Storage Elastic Modulus Using a dynamic viscoelasticity apparatus (manufactured by Seiko Instruments Inc., DMS6100), the temperature was increased at 2° C./min at tensile mode at a frequency of 1 Hz, and the storage elastic modulus at 23° C. was measured.

Production Example 1

A fluorinated copolymer (a-1) was produced as follows using NAH (anhydrous high-mix acid, manufactured by Hitachi Chemical Co., Ltd.) as a monomer to form the constituting units (m2) and PPVE ($CF_2$=$CFO(CF_2)_3F$, perfluoropropyl vinyl ether manufactured by Asahi Glass Company, Limited) as a monomer to form the constituting units (m3).

First, 369 kg of 1,3-dichloro-1,1,2,2,3-pentafluoropropane ("AK225cb" manufactured by Asahi Glass Company, Limited) and 30 kg of PPVE were charged into a preliminarily degassed polymerization vessel having an internal capacity of 430 L and equipped with a stirrer. Then, inside of the polymerization vessel was heated to raise the temperature to 50° C., and 50 kg of TFE was further changed, whereupon the pressure in the polymerization vessel was raised to 0.89 MPa/G.

Further, a polymerization initiator solution was prepared by dissolving (perfluorobutyryl) peroxide at a concentration of 0.36 mass % in AK225cb, and 3 L of the polymerization initiator solution was continuously added at a rate of 6.25 mL per minute into the polymerization vessel, to carry out polymerization. Further, TFE was continuously charged in order to maintain the pressure in the polymerization vessel during the polymerization reaction to be 0.89 MPa/G. Further, a solution prepared by dissolving NAH at a concentration of 0.3 mass % in AK225cb was charged continuously by an amount corresponding to 0.1 mol % based on mols of TFE to be charged during the polymerization.

After 8 hours from the initiation of polymerization, when 32 kg of TFE was charged, the temperature in the polymerization vessel was lowered to room temperature, and the pressure was purged to atmospheric pressure. The obtained slurry was separated from AK225cb by solid-liquid separation and dried at 150° C. for 15 hours, to obtain 33 kg of granules of a fluorinated copolymer (a-1). The specific gravity of the fluorinated copolymer (a-1) was 2.15.

The composition of the fluorinated copolymer (a-1) was the constituting units based on TFE/the constituting units based on NAH/the constituting units based on PPVE=97.9/0.1/2.0 (mol %). The melting point of the fluorinated copolymer (a-1) was 300° C., and MFR was 17.2 g/10 min. The content of the functional group (i) (acid anhydride group) in the fluorinated copolymer (a-1) was 1,000 groups per $1 \times 10^6$ carbon atoms in the main chain of the fluorinated copolymer (a-1).

Production Example 2

The granules of the fluorinated copolymer (a-1) were extruded at a die temperature of 340° C. by means of a single screw extruder having a diameter of 30 mm and having a 750 mm width coat hanger die, to obtain a fluororesin film having a thickness of 12.5 μm (hereinafter referred to as film (1)). With respect to the film (1), MFR (MFR (I)) was measured and found to be 16.9 g/10 min.

Production Example 3

A fluororesin film (hereinafter referred to as film (A1-1)) having a thickness of 50 μm was obtained in the same manner as in Production Example 2 except that the winding rate was changed. With respect to the film (A1-1), MFR (MFR (I)) was measured and found to be 16.9 g/10 min.

Production Example 4

The film (1) and a polyimide film having a thickness of 25 μm (manufactured by Du Pont-Toray Co., Ltd., product name "Kapton 100EN") were laminated in the order of film (1)/polyimide film/film (1) and pressed at a temperature of 360° C. under a pressure of 1.3 MPa for 10 minutes to obtain an adhesive film (A2-1) having a three-layer structure.

From the adhesive film (A2-1), one of the films (1) was separated, and MFR (I) of the film (1) was measured and found to be 16.7 g/10 min.

Ex. 1

The film (A1-1) obtained in Production Example 3 was heat-treated under conditions (temperature and time) as identified in Table 1. MFR (II) and the linear expansion coefficient of the film (A1-1) after the heat treatment were measured. The results are shown in Table 1.

Further, with respect to the film (A1-1) after the heat treatment, infrared absorption spectrum analysis was conducted, and it was confirmed that the acid anhydride residue derived from NAH remained.

Ex. 2

The linear expansion coefficient of the film (A1-1) obtained in Production Example 3 without heat treatment was measured. The results are shown in Table 1. In the rows of MFR (I) and MFR (II) in Table 1, MFR of the film (A1-1) without heat treatment is shown for convenience.

Ex. 3

The adhesive film (A2-1) obtained in Production Example 4 was heat-treated under conditions (temperature and time) as identified in Table 1. The linear expansion coefficient and the relative dielectric constant of the adhesive film (A2-1) after the heat treatment were measured. The results are shown in Table 1.

Further, from the adhesive film (A2-1) after the heat treatment, one of the films (1) was separated, and MFR (II) of the film (1) was measured. The results are shown in Table 1. Further, with respect to the separated film (1), infrared absorption spectrum analysis was conducted, and it was confirmed that the acid anhydride residue derived from NAH remained.

Ex. 4

The linear expansion coefficient and the relative dielectric constant of the adhesive film (A2-1) obtained in Production Example 4 without heat treatment were measured. The results are shown in Table 1. In the rows of MFR (I) and MFR (II) in Table 1, MFR of the film (1) in the adhesive film (A2-1) without heat treatment is shown for convenience.

TABLE 1

| | Ex. 1 | Ex. 2 | Ex. 3 | Ex. 4 |
|---|---|---|---|---|
| | \multicolumn{4}{c}{Object to be heat-treated} | | | |
| | Film (A1-1) | Film (A1-1) | Adhesive film (A2-1) | Adhesive film (A2-1) |
| Heat treatment temperature (° C.) | 285 | — | 285 | — |
| Heat treatment time (hr) | 24 | — | 24 | — |
| MRF (I) (g/10 min) | 16.9 | 16.9 | 16.7 | 16.7 |
| MFR (II) (g/10 min) | 1.7 | 16.9 | 2.1 | 16.7 |
| MFR (II)/MFR (I) | 0.10 | 1 | 0.13 | 1 |
| Linear expansion coefficient (ppm/° C.) 50 to 100° C. | 175 | 198 | 24 | 19 |
| 100 to 150° C. | 223 | 243 | 23 | 23 |
| 150 to 200° C. | 283 | 299 | 23 | 27 |

TABLE 1-continued

|  |  | Ex. 1 | Ex. 2 | Ex. 3 | Ex. 4 |
|---|---|---|---|---|---|
|  |  | \multicolumn{4}{c}{Object to be heat-treated} |
|  |  | Film (A1-1) | Film (A1-1) | Adhesive film (A2-1) | Adhesive film (A2-1) |
| Relative dielectric constant | 2.5 GHz |  |  | 2.85 | 2.85 |
|  | 10 GHz |  |  | 2.82 | 2.82 |
|  | 20 GHz |  |  | 2.68 | 2.73 |

As shown in Table 1, in Ex. 1 in which the heat treatment was conducted, the linear expansion coefficients in the respective temperature ranges lowered as compared with Ex. 2 in which no heat treatment was conducted. Likewise, in Ex. 3 in which the heat treatment was conducted under the specific conditions, the linear expansion coefficient lowered in a high temperature range (150 to 200° C.) as compared with Ex. 4 in which no heat treatment was conducted. Further, the relative dielectric constant was lower at a frequency of 20 GHz in Ex. 3 in which the heat treatment was conducted than in Ex. 4 in which no heat treatment was conducted. It was found from these results that the electrical properties (low dielectric constant) of the fluororesin were further improved at high frequency, by the heat treatment.

Production Example 5

The film (1), a polyimide film having a thickness of 25 μm (manufactured by Du Pont-Toray Co., Ltd., product name "Kapton 100EN"), an electrolytic copper foil having a thickness of 12 μm (manufactured by Fukuda Metal Foil & Powder Co., Ltd., "CF-T4X-SVR-12", surface roughness (Rz): 1.2 μm) were laminated in the order of electrolytic copper foil/film (1)/polyimide film/film (1)/electrolytic copper foil and pressed at a temperature of 360° C. under a pressure of 1.3 MPa for 10 minutes to obtain a metal laminate precursor having metal layers on both sides.

From the metal laminate precursor, the metal layers on both sides were removed by etching, and one of the films (1) was separated, and MFR (V) of the film (1) was measured and found to be 16.7 g/10 min.

Ex. 5, Ex. 6

The metal laminate precursor obtained in Production Example 5 was heat-treated under each of conditions (temperature and time) as identified in Table 2 to obtain a metal laminate.

From the metal laminate after the heat treatment, the metal layers on both sides were removed by etching, and the linear expansion coefficient of the obtained film (1)/polyimide film/film (1) was measured. The results are shown in Table 2.

Further, from the metal laminate after the heat treatment, the metal layers on both sides were removed by etching, one of the films (1) was separated, and MFR (VI) of the separated film (1) was measured. The results are shown in Table 2.

Further, in Ex. 5 and 6, with respect to the film (1), infrared absorption spectrum analysis was carried out, and it was confirmed that the acid anhydride residue derived from NAH remained. For comparison, the above Ex. 4 was also shown in Table 2.

TABLE 2

|  | Ex. 5 | Ex. 6 | Ex. 7 |
|---|---|---|---|
|  | \multicolumn{3}{c}{Object to be heat-treated} |
|  | Metal laminate precursor | Metal laminate precursor | Adhesive film (A2-1) |
| Heat treatment temperature (° C.) | 260 | 285 | — |
| Heat treatment time (hr) | 24 | 24 | — |
| MRF (V) (g/10 min) | 16.7 | 16.7 | 16.7 |
| MFR (VI) (g/10 min) | 4.9 | 1.9 | 16.7 |
| MFR (VI)/MFR (V) | 0.29 | 0.11 | 1 |
| Linear expansion coefficient (ppm/° C.) 50 to 100° C. | 18 | 19 | 19 |
| 100 to 150° C. | 19 | 21 | 23 |
| 150 to 200° C. | 17 | 21 | 27 |

As shown in Table 2, in Ex. 5 and 6 in which the heat treatment was conducted, the linear expansion coefficients in the respective temperature ranges tended to lower as compared with Ex. 4 in which no heat treatment was conducted. Particularly, a reduction in the linear expansion coefficient in a high temperature region (from 150 to 200° C.) was significant. As a result, in Ex. 5 and 6, the difference in the linear expansion coefficient among the respective temperature ranges is decreased by the heat treatment, and the thermal stability of the linear expansion coefficient was indicated.

Ex. 7 to 14

The granules of the fluorinated copolymer (a-1) obtained in Production Example 1 were press-molded to obtain a press-molded product of 80 mm×80 mm×0.25 mm±0.05. Molding was conducted by using a melt hot pressing machine "Hot Press Double" (manufactured by TESTER SANGYO CO., LTD.) at 350° C. under 10 MPa for a pressing time of 5 minutes.

From the obtained molded product, a plate-shaped sample having a length of 30 mm, a width of 5 mm and a thickness of 0.25±0.05 mm was cut out and subjected to a heat treatment under conditions (temperature and time) in each Ex. as identified in Table 3. With respect to the sample piece after the heat treatment (corresponding to the material for a printed circuit board), MFR (II) and the storage elastic modulus were measured. In Ex. 14, no heat treatment was conducted, and the storage elastic modulus was measured. The results are shown in Table 3.

Ex. 15, Ex. 16

Using a PFA-1 (TFE/perfluoro(alkyl vinyl ether) copolymer, melting point: 305° C., MFR: 13.6 g/10 min, manufactured by Asahi Glass Company, Limited, product name "Fluon PFA 73PT" containing no carbonyl group) instead of the fluorinated copolymer (a-1), a press-molded product was obtained in the same manner as in Ex. 7 to 14, and a heat treatment was conducted under conditions (temperature and time) as identified in Table 3. With respect to the sample piece after the heat treatment, MFR (II) and the storage elastic modulus were measured. In Ex. 15, no heat treatment was conducted, and the storage elastic modulus was measured. The results are shown in Table 3.

TABLE 3

|  | Ex. 7 | Ex. 8 | Ex. 9 | Ex. 10 | Ex. 11 | Ex. 12 | Ex. 13 | Ex. 14 | Ex. 15 | Ex. 16 |
| --- | --- | --- | --- | --- | --- | --- | --- | --- | --- | --- |
| Heat treatment temperature (° C.) | 260 | 260 | 285 | 285 | 285 | 285 | 285 | — | — | 285 |
| Heat treatment time (hr) | 24 | 336 | 6 | 12 | 24 | 96 | 336 | — | — | 96 |
| MFR (II) (g/10 min) | 4.6 | 1 | 6.2 | 5.7 | 4.6 | 1.9 | 0.8 | 16.8 | 13.6 | 13.6 |
| MFR (II)/MFR (I) | 0.27 | 0.06 | 0.37 | 0.34 | 0.27 | 0.11 | 0.05 | 1 | 1 | 1 |
| Storage elastic modulus at 23° C. (MPa) | 934 | 893 | 807 | 835 | 936 | 846 | 651 | 527 | 312 | 298 |

As shown in Table 3, in Ex. 7 to 13 in which the heat treatment was conducted, the storage elastic modulus at 23° C. improved as compared with Ex. 14 in which no heat treatment was conducted. The storage elastic modulus is an index for the rigidity as described above. It is indicated that the rigidity increased, and deformation such as warpage tends to be suppressed by conducting the heat treatment under specific conditions.

The storage elastic modulus at high temperature is high when the storage elastic modulus at 23° C. is high, and the storage elastic modulus at high temperature is low when the storage elastic modulus at 23° C. is low. Accordingly, in Ex. 7 to 13, it is indicated that the rigidity at high temperature was also excellent, the linear expansion coefficient at high temperature lowered, and deformation such as warpage at high temperature was less likely to occur.

Further, in Ex. 16 in which PFA-1 having no carbonyl group was used and the heat treatment was conducted under the specific conditions, the storage elastic modulus rather decreased and was not improved as compared with Ex. 15 in which no heat treatment was conducted. It is considered that since PFA-1 contains no carbonyl group-containing group, a crosslinked structure was not formed even when a heat treatment was conducted.

INDUSTRIAL APPLICABILITY

The printed circuit board obtained by the production method of the present invention is useful as a flexible printed circuit board which is required to have a high level of electrical reliability.

This application is a continuation of PCT Application No. PCT/JP2016/063760, filed on May 9, 2016, which is based upon and claims the benefit of priority from Japanese Patent Application No. 2015-096471 filed on May 11, 2015. The contents of those applications are incorporated herein by reference in their entireties.

What is claimed is:

1. A method for producing a material for a printed circuit board, comprising:
   subjecting a film (A) provided with a fluorinated resin layer comprising a composition comprising a fluorinated copolymer (a) to a heat treatment to obtain a material for a printed circuit board, wherein
   the film (A) is a film (A1) consisting of the fluorinated resin layer or an adhesive film (A2) having the fluorinated resin layer directly laminated on at least one side of a heat resistant resin film,
   the fluorinated copolymer (a) has at least one functional group selected from the group consisting of a carbonyl group-containing group, a hydroxy group, an epoxy group and an isocyanate group, has a melting point of from 280 to 320° C., and has a melt flow rate of at least 2 g/10 min measured at 372° C. under a load of 49N, and
   the heat treatment of the film (A) is carried out at a temperature of at least 250° C. and lower by at least 5° C. than the melting point of the fluorinated copolymer (a) so that the ratio of the following melt flow rate (II) (MFR(II)) to the following melt flow rate (I) (MFR(I)) [MFR(II)/MFR(I)] is from 0.05 to 0.5 and that the following MFR(II) is at most 15 g/10 min, wherein,
   MFR(I): the melt flow rate of the fluorinated resin layer before the heat treatment measured at 372° C. under a load of 49N; and
   MFR(II): the melt flow rate of the fluorinated resin layer after the heat treatment measured at 372° C. under a load of 49N.

2. The method for producing a material for a printed circuit board according to claim 1, wherein the fluorinated copolymer (a) has at least a carbonyl group-containing group as the functional group, and the carbonyl group-containing group is at least one selected from the group consisting of a group having a carbonyl group between carbon atoms in a hydrocarbon group, a carbonate group, a carboxy group, a haloformyl group, an alkoxycarbonyl group and an acid anhydride residue.

3. The method for producing a material for a printed circuit board according to claim 1, wherein the content of the functional group is from 10 to 60,000 groups per $1\times10^6$ carbon atoms in the main chain of the fluorinated copolymer (a).

4. A method for producing a metal laminate, comprising:
   producing a material for a printed circuit board by the method according to claim 1; and
   directly laminating a metal layer on the fluororesin layer of the material for a printed circuit board.

5. A method for producing a printed circuit board, comprising:
   producing a metal laminate by the method according to claim 4; and
   etching the metal layer to form a patterned circuit.

6. The method for producing a printed circuit board according to claim 5, wherein the formed patterned circuit is soldered by a soldering iron.

7. A method for producing a metal laminate, comprising:
   subjecting a metal laminate precursor comprising an adhesive film (A2) having a fluorinated resin layer comprising a composition comprising a fluorinated copolymer (a) directly laminated on at least one side of a heat resistant resin film, and a metal layer directly laminated on the at least one fluorinated resin layer, to a heat treatment to obtain a metal laminate, wherein
   the fluorinated copolymer (a) has at least one functional group selected from the group consisting of a carbonyl group-containing group, a hydroxy group, an epoxy group and an isocyanate group, has a melting point of from 280 to 320° C., and has a melt flow rate of at least 2 g/10 min measured at 372° C. under a load of 49N, and the heat treatment is carried out at a temperature of at least 250° C. and lower by at least 5° C. than the melting point of the fluorinated copolymer (a) so that the ratio of the following melt flow rate (VI) (MFR(VI)) to the following melt flow rate (V) (MFR(V)) [MFR(VI)/MFR(V)] is from 0.05 to 0.5 and that the following MFR(VI) is at most 15 g/10 min, wherein, MFR(V): the melt flow rate of the fluorinated resin layer before the heat treatment measured at 372° C. under a load of 49N; and MFR(VI): the melt flow rate of the fluorinated resin layer after the heat treatment measured at 372° C. under a load of 49N.

8. The method for producing a metal laminate according to claim 7, wherein the fluorinated copolymer (a) has at least a carbonyl group-containing group as the functional group, and the carbonyl group-containing group is at least one selected from the group consisting of a group having a carbonyl group between carbon atoms in a hydrocarbon group, a carbonate group, a carboxy group, a haloformyl group, an alkoxycarbonyl group and an acid anhydride residue.

9. The method for producing a metal laminate according to claim 7, wherein the content of the functional group is from 10 to 60,000 groups per $1\times10^6$ carbon atoms in the main chain of the fluorinated copolymer (a).

10. The method for producing a metal laminate according to claim 7, wherein the fluorinated resin layer has a thickness of from 1 to 20 μm.

11. A method for producing a printed circuit board, comprising:

producing a metal laminate by the method according to claim 7; and etching the metal layer to form a patterned circuit.

12. The method for producing a printed circuit board according to claim 11, wherein the patterned circuit is soldered by a soldering iron.

* * * * *